(12) United States Patent
Klamm et al.

(10) Patent No.: US 8,981,872 B2
(45) Date of Patent: Mar. 17, 2015

(54) ANTENNA DUPLEXER WITH HIGH GPS SUPPRESSION

(75) Inventors: Helmut Klamm, Munich (DE); Peter Selmeier, Maitenbeth (DE)

(73) Assignee: EPCOS AG, Munich (DE)

( * ) Notice: Subject to any disclaimer, the term of this patent is extended or adjusted under 35 U.S.C. 154(b) by 1003 days.

(21) Appl. No.: 13/122,816

(22) PCT Filed: Oct. 15, 2009

(86) PCT No.: PCT/EP2009/063510
§ 371 (c)(1),
(2), (4) Date: Jun. 28, 2011

(87) PCT Pub. No.: WO2010/043687
PCT Pub. Date: Apr. 22, 2010

(65) Prior Publication Data
US 2011/0248794 A1 Oct. 13, 2011

(30) Foreign Application Priority Data
Oct. 17, 2008 (DE) .......................... 10 2008 052 222

(51) Int. Cl.
*H03H 9/70* (2006.01)
*H03H 9/72* (2006.01)

(52) U.S. Cl.
CPC .............. *H03H 9/706* (2013.01); *H03H 9/725* (2013.01)
USPC .......... 333/133; 333/189; 333/193; 333/195; 455/82

(58) Field of Classification Search
USPC ......... 333/133, 189, 193, 195; 455/78, 82, 83
See application file for complete search history.

(56) References Cited

U.S. PATENT DOCUMENTS

| 6,522,219 B2 * | 2/2003 | Takamiya et al. .............. 333/133 |
| 6,552,632 B2 * | 4/2003 | Inoue et al. .................... 333/195 |
| 6,747,530 B1 | 6/2004 | Selmeier | |

(Continued)

FOREIGN PATENT DOCUMENTS

| DE | 199 32 649 A1 | 2/2001 |
| DE | 103 05 379 A1 | 8/2004 |

(Continued)

OTHER PUBLICATIONS

Mourot et al.; "Coupled Resonator Filters for W-CDMA Duplexer Application"; IEEE Topical Meeting on Silicon Monolithic Integrated Circuits in RF Systems,2008. SiRF 2008, pp. 214-217, Jan. 23-25, 2008.*

(Continued)

*Primary Examiner* — Barbara Summons
(74) *Attorney, Agent, or Firm* — Slater & Matsil, L.L.P.

(57) ABSTRACT

An antenna duplexer includes a transmission filter which operates in a transmission frequency band and has a transmission filter output. A reception filter operates in a reception frequency band and has a reception filter output. An antenna connection is connected to the transmission filter output and a matching element is connected between the antenna connection and the reception filter input. The circuit formed from the transmission filter, reception filter and matching element attenuates transmission signals in a frequency band whose frequencies f are in the interval $0.50*f_0 \leq f \leq 0.75*f_0$, where $f_0$ is the mid-frequency of the reception frequency band.

25 Claims, 4 Drawing Sheets

(56) References Cited

U.S. PATENT DOCUMENTS

| | | | |
|---|---|---|---|
| 7,053,731 | B2 | 5/2006 | Iwamoto et al. |
| 7,376,440 | B2 * | 5/2008 | Forrester et al. ............ 455/553.1 |
| 7,420,438 | B2 * | 9/2008 | Nakai et al. .................... 333/133 |
| 7,446,629 | B2 * | 11/2008 | Nakamura et al. ............. 333/133 |
| 7,498,899 | B2 * | 3/2009 | Iwaki et al. .................... 333/133 |
| 8,179,207 | B2 * | 5/2012 | Tanaka ........................... 333/133 |
| 2004/0212451 | A1 | 10/2004 | Iwamoto et al. |
| 2005/0237129 | A1 | 10/2005 | Kawamura |
| 2005/0245201 | A1 * | 11/2005 | Ella et al. ......................... 455/78 |
| 2006/0017522 | A1 * | 1/2006 | Bradley et al. ................. 333/133 |
| 2006/0091975 | A1 | 5/2006 | Schmidhammer et al. |
| 2008/0186106 | A1 * | 8/2008 | Christian et al. .............. 333/133 |
| 2008/0258983 | A1 | 10/2008 | Bauer et al. |
| 2008/0290965 | A1 | 11/2008 | Pitschi et al. |
| 2010/0188165 | A1 * | 7/2010 | Nakamura et al. ............ 333/124 |

FOREIGN PATENT DOCUMENTS

| | | |
|---|---|---|
| DE | 10 2005 056 340 A1 | 5/2007 |
| DE | 10 2006 044 663 A1 | 4/2008 |
| EP | 1 653 615 A1 | 5/2006 |
| EP | 1 860 773 A2 | 11/2007 |
| JP | 8-65089 * | 3/1996 |
| JP | 2004173236 A | 6/2004 |
| JP | 2004328676 A | 11/2004 |
| JP | 2006135447 A | 5/2006 |
| JP | 2007312324 A | 11/2007 |
| WO | WO 2007/048376 A1 | 5/2007 |

OTHER PUBLICATIONS

Nakamura et al.; "A Small-Sized SAW Duplexer on a SiO2/IDT/LiNbO3 Structure for Wideband CDMA Application"; IEEE 2007 Ultrasonics Symposium, pp. 488-491, Oct. 28-31, 2007.*

Hikita et al.; "Investigation of SAW W-CDMA Antenna Duplexer and GSM-Based FEM Including Duplexer"; IEEE 2004 Ultrasonics Symposium, vol. 2, pp. 970-973, Aug. 23-27, 2004.*

Metzger et al.; "Selection of Micro-Acoustic Technologies for the Realization of Single-Ended/Balanced WCDMA Duplexers"; 2008 IEEE MTT-S International Microwave Symposium Digest, pp. 835-839, Jun. 15-20, 2008.*

Volatier et al.; "Design, Elaboration and Characterization of Coupled Resonator Filters for WCDmA Applications"; 2006 IEEE Ultrasonics Symposium, pp. 829-832, Oct. 2-6, 2006.*

Pitschi et al.; "High Performance Microwave Acoustic Components for Mobile Radios"; 2009 IEEE International Ultrasonics Symposium, pp. 1-10, Sep. 20-23, 2009.*

* cited by examiner

ANTENNA DUPLEXER WITH HIGH GPS SUPPRESSION

This patent application is a national phase filing under section 371 of PCT/EP2009/063510, filed Oct. 15, 2009, which claims the priority of German patent application 10 2008 052 222.8, filed Oct. 17, 2008, each of which is incorporated herein by reference in its entirety.

TECHNICAL FIELD

The invention relates to an antenna duplexer with high suppression in the GPS frequency band.

BACKGROUND

Duplexers, which are used, for example, in portable communication appliances, on the one hand have the purpose of passing on transmission signals from transmission paths to an antenna connection without them being passed into reception paths, which are intended for received signals and have sensitive low-noise amplifiers. This means that duplexers thus must have the capability to carry a large amount of power in the transmission path at the transmission frequencies and, ideally, a low insertion loss in the pass band, since this is the only way to achieve a communication appliance with a low power consumption. High suppression of the transmission path at the reception frequencies is required in order to protect the reception path against the high levels of the transmission signal.

Duplexers should likewise pass received signals from an antenna connection into a reception path with as little further attenuation as possible in order to ensure high reception path sensitivity even at low useful signal levels. For this purpose, a low insertion loss is also a necessary precondition for the reception filter.

Furthermore, an antenna duplexer is intended to prevent the emission of transmission power in undesirable frequency ranges either leading to interference in other radio systems or to interference being produced in the device itself at frequencies at which signals at very low levels are intended to be received, for example, GPS. In order to achieve this, high suppression is required in the transmission path in the relevant frequency ranges (for example, GPS, WLAN, harmonics of the transmission signal).

Correspondingly, therefore, duplexers should ideally have a low insertion loss in respective pass bands, with high suppression in the other frequency ranges. In the mobile radio field, SAW or BAW duplexers (SAW=surface acoustic wave, BAW=bulk acoustic wave) are preferably used because of the filter characteristic which is achieved in a very small physical form.

For example, one duplexer circuit is known from the document U.S. Pat. No. 7,053,731 B2.

For antenna duplexers in the mobile radio bands in the 2 GHz range (for example, Bands I, II, III, IV or VII), simultaneous compliance with all the requirements stated above is more difficult than in the 1 GHz range.

For SAW components, it is not possible to use solely a DMS filter structure (double mode SAW), which leads to low insertion losses and high broadband suppression levels even while away from the pass band frequencies, for the transmission filter, because DMS structures do not have the required power handling capability, in particular in the 2 GHz range. So-called "ladder-type" structures are therefore used for the transmission filter.

For BAW, the use of so-called coupled resonator structures involves an extremely complex process, and the ladder-type structure is therefore currently also used here.

However, the use of the ladder-type structure for the transmission filter fundamentally has the disadvantage that the transmission filter therefore has inadequate broadband suppression at the required level for the insertion loss.

In addition, the dissipated losses which increase at high frequencies make it harder to achieve low insertion losses. The measures to reduce the insertion loss that are known for ladder-type structures are on the one hand to reduce the capacitance ratio of the parallel to series resonators and on the other hand to reduce the number of ladder-type basic elements used. However, both measures lead to a reduction in the broadband suppression level, which is therefore contrary to the requirement for the transmission filter. If the above measures were to be implemented in the opposite sense in order to achieve the required suppression, the insertion loss would be increased, and the bandwidth and gradient in the bandpass filter would be reduced.

For narrow band selection requirements above the transmission band, additional suppression can be achieved by measures such as shifting pole points above the transmission band—as described in the German patent document DE 199 32 649 A1.

However, the options for narrow band selection requirements well below the transmission band are very restricted. The GPS frequency range (1574-1577 MHz) is, however, actually below the device's own transmission range for a 2 GHz duplexer.

One previously known measure for increasing the suppression outside the pass band frequencies of duplex circuits, in particular of duplexer circuits which are intended for use at mid-frequencies in the region of 2 GHz, which are intended to have high suppression of the transmission signals at GPS frequencies, is, for example, based on deliberately positioning acoustic poles below the pass band frequencies for GPS frequencies. One disadvantage is that an additional reactance element is required for this purpose, typically an inductance. This inductance has to be chosen to be greater the further the acoustic pole point is intended to be away from the pass band. A further disadvantage is that the suppression decreases considerably in the frequency range between the pass band and the frequency of the acoustic pole.

SUMMARY OF THE INVENTION

In one aspect, the present invention specifies an antenna duplexer which, in comparison to known duplexer circuits, has a reduced insertion loss in the transmission band and, at the same time, increased suppression in other frequency ranges, in particular of transmission signals in the GPS band. One particular aim of the present invention is to specify a duplexer having a reception frequency of >2000 MHz, which has an insertion loss in the transmission band of <2 dB, and whose transmission filter has a suppression in the GPS band of >40 dB.

The antenna duplexer according to the present invention comprises a transmission filter which operates in a transmission frequency band and has a transmission filter output, a reception filter which operates in a reception frequency band and has a reception filter input, an antenna connection which is connected to the transmission filter output, and a matching element which is connected between the antenna connection and the reception filter input. The circuit comprising the transmission filter, reception filter and matching element attenuates transmission signals in a frequency band whose frequencies f are in the interval $0.50*f_0 \leq f \leq 0.75*f_0$, where $f_0$, the mid-frequency of the reception frequency band, is higher than 2000 MHz.

Any circuit, which not only maps the impedance of the reception filter in the region of its pass band frequency on to the antenna impedance required by the duplexer (normally 50 Ohms) once again but also transforms the impedance of the reception filter to an open circuit in the region of the frequency of the transmission filter, may be used as a matching element. In addition, the matching element is intended to transform the impedance of the reception filter in the range between 50 and 75 percent of the mid-frequency of the reception frequency band to a short circuit, such that the transmission filter produces an attenuation of at least 40 dB in the range between 50 and 75 percent of the mid-frequency of the reception frequency band.

In one particularly advantageous embodiment, the matching element comprises a so-called λ/4 line, with which it achieves the object mentioned above. A λ/4 line is understood to be a conductor section whose geometric length corresponds to one quarter of the wavelength λ of an electromagnetic wave at a desired operating frequency $f_0$. The wavelength and operating frequency are related via the speed of propagation c of the wave on the line, as follows:

$$\lambda = \frac{c}{f_0} = \frac{c_0}{f_0 \sqrt{\mu_r \varepsilon_r}}$$

where $c_0$=the speed of light in a vacuum, $\mu_r$=the relative permeability and $\varepsilon_r$=the relative dielectric constant of the insulator surrounding the line.

In a further particularly advantageous embodiment of the matching element, the matching element comprises a circuit formed from capacitive, inductive or resistive reactance elements. The three functions mentioned above can, for example, be carried out by matching networks as illustrated in FIGS. 2B to 2G specifically in the form of Pi or T circuits with inductive elements connected between the antenna connection and the reception filter, and with capacitive elements connected in parallel paths to ground. It is likewise also possible to connect capacitive elements between the antenna connection and the reception filter and to connect them by parallel paths to the ground via inductive elements.

Transmission filters or reception filters advantageously comprise bandpass filter circuits composed of SAW components. Such SAW components consist of a piezoelectric substrate, on which interdigital transducers in the form of metallic structures are arranged. SAW components are particularly suitable for use in mobile communication appliances since, as passive elements, they do not require any additional power supply and offer a large number of degrees of freedom in order to vary the profile of the frequency-dependent insertion loss. Appropriately designed SAW components therefore have very good filter characteristics.

One advantageous embodiment of a transmission or reception filter is to connect basic elements composed of SAW series resonators and SAW parallel resonators to form a ladder-type filter. In this case, all the series resonators of the individual basic elements are connected to one another in series, while the parallel resonators of the individual basic elements are connected between the corresponding series resonators and ground. Ladder-type filters are distinguished by a high power handling capability. They are therefore particularly suitable for connection in transmission paths between a power amplifier and an antenna. Furthermore, on the antenna side, it is also possible to connect at least one basic element of a ladder-type structure in the reception filter since this position is most likely subject to the full power of the transmission signal path. In particular, a parallel resonator can dissipate transmission signals which must not pass through the reception filter via ground.

At the frequencies above 2 GHz, which are licensed for mobile radio, the coupling coefficient K, which is defined by the substrate material:

$$k^2 = \frac{f_a^2 - f_r^2}{f_a^2}$$

results in a bandpass filter bandwidth which, for individual applications such as WCDMA Band VII, is considerably greater than that required in the application. In this case, $f_r$ is the resonant frequency and $f_a$ is the anti-resonant frequency of an SAW resonator. When high near selection is required, the bandwidths are too great and the flank gradients too shallow, unless additional measures are taken.

It has been found that steep flanks can be achieved for the insertion loss and bandpass characteristic in advantageous refinements by arranging additional electrically capacitive but acoustically inactive elements, for example in the form of interdigital structures, on the piezoelectric substrate, which are connected in parallel with the parallel or series resonators. In order to avoid such structures having an acoustic effect, it is possible to arrange these aligned with respect to a crystal structure of the substrate such that the electro acoustic coupling coefficient k is as low as possible. This means that these interdigital structures scarcely have any electro acoustic interaction with the substrate. Their interaction with the rest of the ladder-type filter structure is therefore in practice restricted to their purely electrical-capacitive characteristics. The additional inactive structures reduce the effective frequency separation of $f_r$ and $f_a$ of the respective active resonator element.

In this case, such acoustically inactive interdigital structures, which are connected in parallel with the series resonators, result in an improvement in the gradient of the right-hand flank, and acoustically inactive interdigital structures which are connected in parallel with the parallel resonators result in an improvement in the corresponding left-hand flank in the pass band characteristic. On the basis of the normal convention, according to which transmission filters are positioned with their frequencies below the reception filters, this method allows an improvement in the right-hand flank of the transmission band and the left-hand flank of the reception band. However, this concept is not dependent on such conventions, but in general allows an improvement in the gradient of the upper and lower flanks.

A further embodiment is to provide interdigital transducers with a weighting. Weightings may consist, for example, of varying the overlap of adjacent fingers of the interdigital transducers, corresponding to a suitable function, depending on the position in the longitudinal direction. This optimizes the shape of the pass band. Other optional weighting options consist of so-called omission weighting, in which the number of fingers of energizing fingers in specific regions along the longitudinal direction is reduced in accordance with a weighting function. Alternatively, it is also possible to correspondingly increase the finger width as a function of the position. These variation options result in additional degrees of freedom for matching of the insertion loss.

If the reception filter of a duplexer is subject to very stringent suppression requirements not only in the region of the transmission band but, furthermore, also in a wider frequency range, then an advantageous embodiment is obtained by connecting DMS filter structures within the reception filter. Since the requirements relating to the power handling capability are considerably less stringent in the reception filter than in the transmission filter, a DMS structure can be used. Furthermore, the use of a DMS structure offers the capability for impedance transformation and provision of a balanced filter output.

A further refinement is to connect BAW elements as acoustic resonators in bandpass filters.

As a result of the trend for ever greater miniaturization, one advantageous refinement consists of connecting a plurality of ground connections of transmission or reception filters to jointly used ground connecting pads, which are structured as metalized surfaces on the chip. Such metalized surfaces are normally arranged over a large area on the substrate, in comparison to interdigital structures. A reduced total number of ground connecting pads therefore saves space on the chip and, correspondingly, saves production costs.

A chip such as this, which comprises one or more filter circuits, for example, BAW resonators arranged as structured interdigital transducers on a piezoelectric substrate or applied in layers to an electric insulating substrate, can be arranged and connected in a desired manner on a mount substrate composed of HTCC (high temperature cofired ceramics), LTCC (low temperature cofired ceramics) or laminate. In advantageous refinements, the mount substrate then comprises a plurality of layers between which, and/or on which, reactive elements such as resistive, inductive or capacitive elements or other circuit elements such as $\lambda/4$ lines are arranged, in the form of structured metallization. Such reactive elements can be connected to one another through vias.

As the frequencies become ever higher, the electromagnetic wavelength in the chip or in the mount substrate decreases ever further, as a result of which the matching element may in one advantageous embodiment be formed at least partially on the chip surface.

Particularly in the case of matching networks with a capacitor directly adjacent to the reception filter input, this capacitance can advantageously be provided on the chip. Either electrically capacitive but acoustically inactive elements can thus be arranged in the form of interdigital structures, for example, or acoustically active elements can be appropriately dimensioned such that they can carry out two functions at the same time.

In the case of a $\lambda/4$ line, the partial embodiment in the chip can be implemented, for example, by a structured interconnect. In addition, individual circuit elements of the matching element can be integrated in the form of structured metallizations in a multilayer mount substrate.

The antenna duplexer is preferably used in frequency bands whose mid-frequency $f_0$ of the reception frequency band is at frequencies of more than 2000 MHz. With the present frequency convention, for example for a number of WCDMA bands, the frequency interval is then $0.50*f_0 <= f <= 0.75*f_0$ in the range above 1000 MHz. In particular, the frequency range of the GPS band is covered by said interval. At these frequencies, $\lambda/4$ lines can be integrated "on chip" as a matching element or as parts of the matching network in the form of reactive elements: for example, if the matching element consists of LC circuits, then it is possible to structure some or all of the capacitive or inductive elements of these circuits on the chip surface.

The insertion loss in the transmission frequency band is preferably less than 2 dB with transmission signals in a frequency interval between 1400 and 1700 MHz at the same time being attenuated by the matching element in conjunction with the transmission filter and the reception filter.

The transmission filter preferably comprises a first bandpass filter with a first pass band, and the reception filter preferably comprises a second bandpass filter with a second pass band. The following frequency bands, which are particularly preferably used, exist at the moment (for the WCDMA system):

the first pass band is between 1710 and 1755 MHz and the second pass band is between 2110 and 2155 MHz (Band IV), or the first pass band is between 1710 and 1770 MHz and the second pass band is between 2110 and 2170 MHz (Band X), or the first pass band is between 1900 and 1920 MHz and the second pass band is between 2600 and 2620 MHz (Band XV), or the first pass band is between 1920 and 1980 MHz and the second pass band is between 2110 and 2170 MHz (Band I), or the first pass band is between 2010 and 2025 MHz and the second pass band is between 2585 and 2600 MHz (Band XVI), or the first pass band is between 2500 and 2570 MHz and the second pass band is between 2620 and 2690 MHz (Band VII).

In an entirely general form, the duplexer circuit is suitable for all WCDMA bands between 1710 MHz and 2690 MHz.

In the case of the WCDMA Band VII, interference transmission signals in the GPS frequency band are suppressed in particular.

It is particularly preferable for the duplexer circuit comprising a matching element, transmission filter and reception filter to attenuate transmission signals in a frequency interval between 1574 and 1577 MHz by at least 50 dB. Currently, this frequency interval corresponds to the GPS band. An antenna duplexer such as this is correspondingly used in a mobile communication appliance with a GPS receiver for position finding.

BRIEF DESCRIPTION OF THE DRAWINGS

The antenna duplexer will be explained in more detail in the following text with reference to exemplary embodiments and associated schematic figures, in which.

The following list of reference symbols may be used in conjunction with the drawings:

AA: Antenna connection
AD: Antenna duplexer

AE: Matching element
AIR: Acoustically inactive resonator
AN: Antenna
BPF: Bandpass filter circuit
BR: BAW resonator
DMS: DMS filter
EF: Reception filter
EFE: Reception filter input
EFI: Electrode finger
EL: Electrode
IDS: Interdigital structure
IE: Inductive element
KE: Capacitive element
L4: $\lambda/4$ line
LF: Ladder-type filter circuit
M: Ground
MAP Ground connecting pad
PR: Parallel resonator
PS: Piezoelectric layer
PSu: Piezoelectric substrate
SF Transmission filter
SFA: Transmission filter output
SR: Series resonator
TS: Mount substrate
VE Circuit formed from capacitive, resistive and inductive elements

DETAILED DESCRIPTION OF ILLUSTRATIVE EMBODIMENTS

Figure 1:
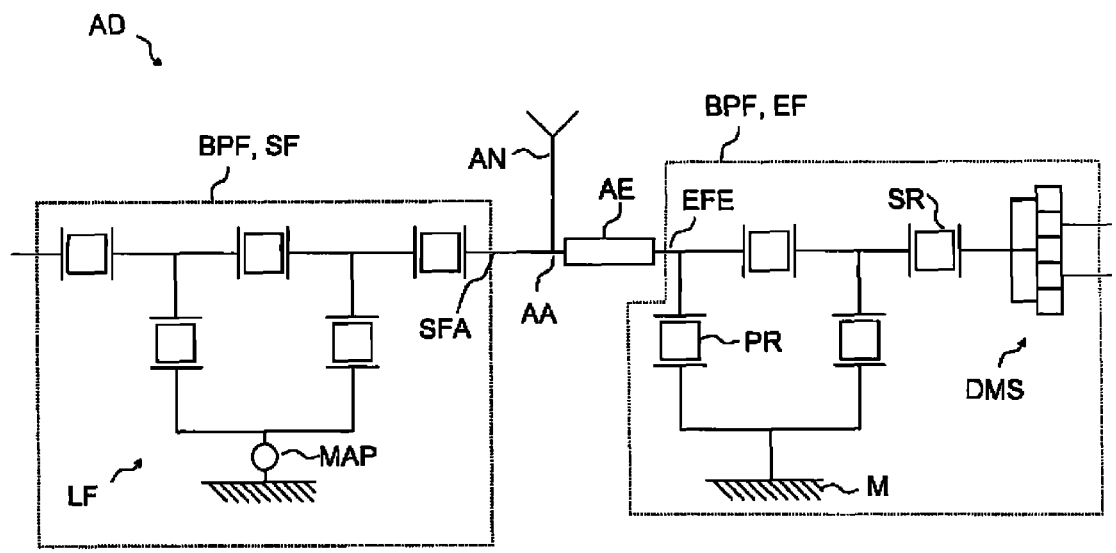
FIG. 1 shows one possible embodiment of the antenna duplexer with an antenna connection, reception filter with reception filter input, transmission filter with transmission filter output, antenna connection and matching element.

FIG. 1 shows one possible configuration of the antenna duplexer AD. A matching element AE is connected between a transmission filter output SFA and a reception filter input EFE. A signal line is connected between the transmission filter output SFA and the matching element AE to an antenna connection AA, which is electrically conductively connected to an antenna AN. Both the transmission filter SF and the reception filter EF consist of bandpass filters BPF, which each comprise a ladder-type filter structure LF. On the output side, the reception filter EF additionally has a DMS filter DMS. The first element on the input side in the reception filter EF is a parallel resonator PR, which connects the reception filter input EFE to ground M. An indication is provided in the transmission filter SF of how two different parallel resonators are connected to a joint ground pad MAP which is electrically conductively connected to ground. This ground pad MAP is arranged on the piezoelectric substrate, thus reducing the total number of ground pads on the substrate, and saving space.

Figure 2A:
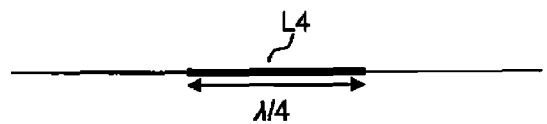
FIG. 2A shows a $\lambda/4$ line.

FIG. 2A shows a so-called $\lambda/4$ line L4. This means a conductor section whose geometric length corresponds to one quarter of the wavelength of an electromagnetic wave at a desired operating frequency. A $\lambda/4$ line may be arranged stretched out, or else a $\lambda/4$ line may, for example, also be structured in a meandering shape on a surface, or may be arranged as electrically conductive strips in different layers of a multilayer substrate.

Figure 2B:
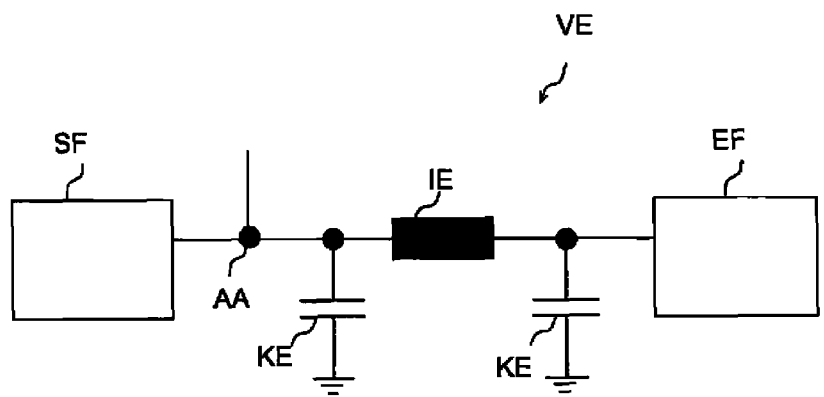
FIGS. 2B to 2G show circuits formed from capacitive, inductive and resistive elements.

FIG. 2B shows one possible circuit VE formed from capacitive and inductive elements which comprises, in the form of a so-called "Pi" circuit, an inductive element IE, which is connected between the antenna connection AA and the reception filter EF. In addition, the inductive element is connected to ground via a respective capacitive element KE at both electrodes. A circuit such as this can be used not only as a circuit having a $\lambda/4$ line but as a matching element AE.

Figure 2C:
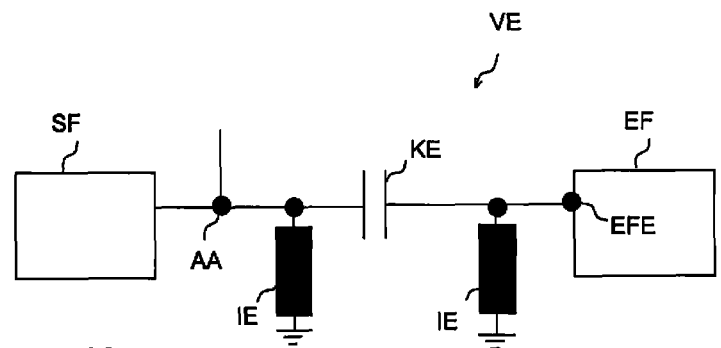

FIG. 2C shows a further possible circuit VE formed from capacitive and inductive elements which can be used as a matching element. Once again in the form of a Pi circuit, it comprises a capacitive element KE, which is connected between the antenna connection AA and the reception filter input EFE. In addition, the capacitive element KE is connected to ground by in each case one inductive element IE, at both electrodes.

Figure 2D:
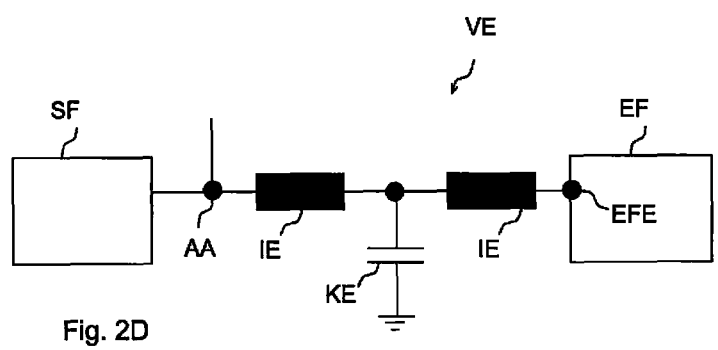

FIG. 2D shows a further possible circuit formed from capacitive and inductive elements, which can be used as a matching element. In the form of a so-called "T" circuit, this comprises two inductive elements IE connected in series between the antenna connection (AA) and the reception filter input (EFE). In addition, the junction point between the inductive elements IE is connected to ground via a capacitive element KE, which represents the parallel arm of the T-circuit.

Figure 2E:
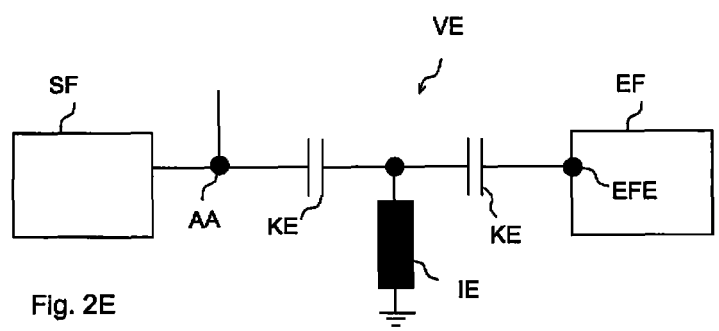

FIG. 2E shows a further possible circuit formed from capacitive and inductive elements, which can be used as a matching element. In the form of a T circuit, this comprises two capacitive elements KE connected in series between the antenna connection (AA) and the reception filter input EFE. In addition, the junction point between the capacitive elements KE is connected to ground via an inductive element IE, which represents the parallel arm of the T circuit.

Figure 2F:
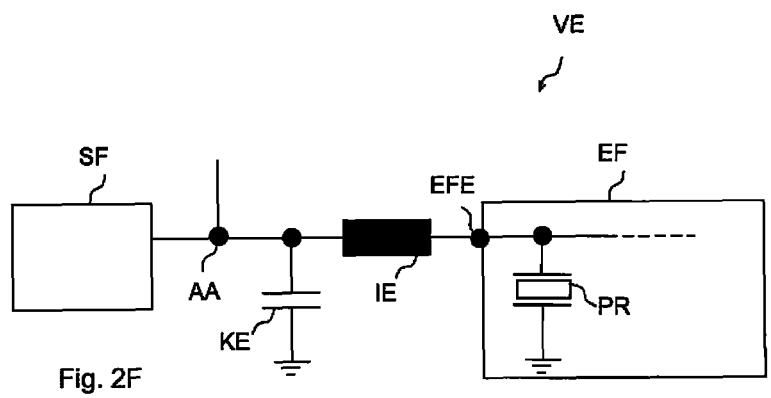

FIG. 2F shows a further possible circuit VE formed from capacitive and inductive elements, which can be used as a matching element. This is based on a circuit as shown in FIG. 2B. However, the capacitive element KE which is connected between the reception filter and ground there is in the form of an acoustically active or acoustically inactive element, as an interdigital structure PR on the chip.

Figure 2G:
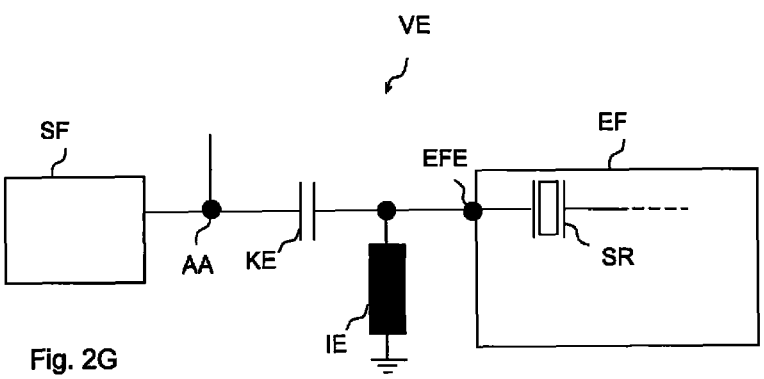

FIG. 2G shows a further possible circuit formed from capacitive and inductive elements, which can be used as a matching element. This is based on a circuit as shown in FIG. 2E. The capacitive element KE which is connected there to the reception filter input is, however, in the form of an acoustically active or acoustically inactive element, as an interdigital structure SR on the chip.

Figure 3A:
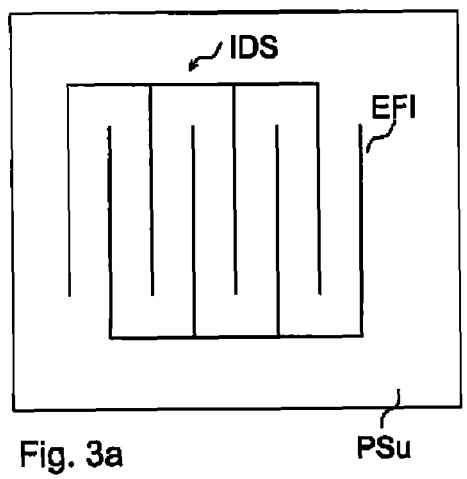
FIG. 3A shows the arrangement of an interdigital structure on a piezoelectric substrate.

FIG. 3A symbolically illustrates the arrangement of an interdigital structure IDS on a piezoelectric substrate PSu. An interdigital structure IDS comprises electrode combs, whose electrode fingers EFI engage in one another like a comb. Depending on the alignment of the electrode fingers EFI on the substrate, surface acoustic wave oscillations can be excited in the piezoelectric substrate and propagates along the surface of the piezoelectric substrate PSu, at right angles to the electrode fingers EFI.

Figure 3B:
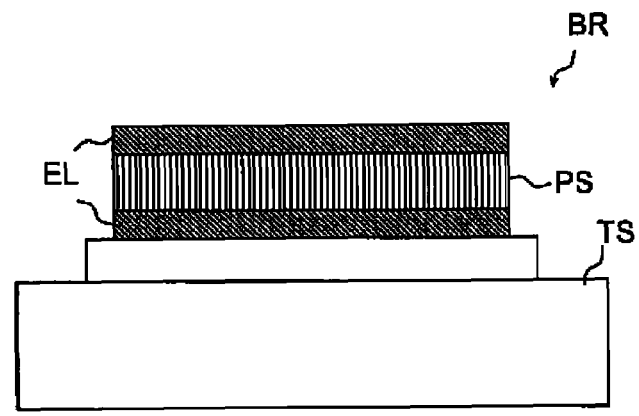
FIG. 3B shows the layer structure of a BAW resonator on a chip.

FIG. 3B shows a basic configuration of a BAW resonator BR, in the form of a cross section. Electrodes EL, between which a piezoelectric layer PS is arranged, are arranged on a mount substrate TS. When an RF AC voltage is applied to the two electrodes, they produce acoustic volume oscillations in the piezoelectric layer, depending on its thickness.

Figure 4:
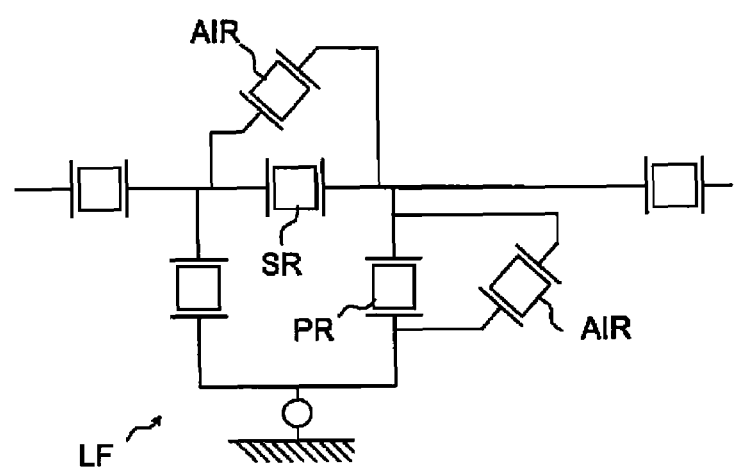
FIG. 4 shows a filter circuit similar to a ladder type, with acoustically inactive parallel resonators.

FIG. 4 shows a ladder-type filter circuit LF with two additionally acoustically inactive resonators AIR. Piezoelectric substrates are in general crystalline and are anisotropic, corresponding to their crystal axes. There are directions in/on the crystal surface along which acoustic waves can be excited in a preferred manner by interdigital structures, and directions along which acoustic waves are virtually impossible to excite. Acoustically inactive resonators AIR are produced, in which case corresponding interdigital structures are arranged on the basis of the latter directions. This is symbolized in FIG. 4 by the illustration of the resonators rotating through 45°. This and the other figures represent schematic drawings in which neither the angles nor the dimensions may be illustrated correctly.

Figure 5:
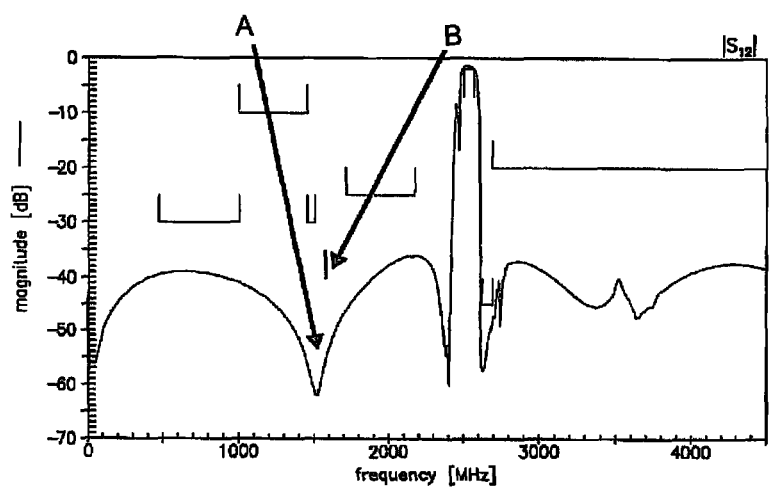
FIG. 5 shows a pass curve of a transmission filter of an antenna duplexer.

FIG. 5 shows a pass curve of a Tx filter in an antenna duplexer according to the invention, which is designed for the WCDMA band VII. The arrow A indicates the particularly good attenuation in the GPS band which, in the illustrated example, is well below the specification (see arrow B), at about 60 db.

An antenna duplexer is not restricted to one of the described exemplary embodiments. Variations which also comprise further circuit elements, for example additional resonators, LC circuits or other circuits formed from resistive, capacitive or inductive elements, likewise represent exemplary embodiments according to the invention.

The invention claimed is:

1. An antenna duplexer, comprising:
a transmission filter that operates in a transmission frequency band and has a transmission filter output,
a reception filter that operates in a reception frequency band and has a reception filter input,
an antenna connection connected to an output of the transmission filter, and
a matching element connected between the antenna connection and an input of the reception filter,
wherein the reception filter comprises a ladder-type filter circuit disposed on an antenna side of the reception filter, the reception filter further comprising a double mode surface acoustic wave (DMS) filter,
wherein the ladder-type filter circuit comprises interdigital structures that are each connected in parallel with a series resonator, the interdigital structures comprising electrode fingers aligned on a piezoelectric substrate to produce a negligible electro acoustic coupling coefficient,
wherein a first element on the input of the reception filter is a parallel resonator,
wherein the matching element transforms an impedance of the reception filter in the range between 50 and 75 percent of a mid-frequency of the reception frequency band to a short circuit, and
wherein the matching element together with the transmission filter and the reception filter, attenuates transmission signals by at least 40 dB in a frequency band whose frequencies f are in the interval $0.50*f_0 <= f <= 0.75*f_0$, where $f_0$ is a mid-frequency of the reception frequency band and is higher than 2000 MHz.

2. The antenna duplexer as claimed in claim 1, wherein the matching element comprises a λ/4 line.

3. The antenna duplexer as claimed in claim 1, wherein the matching element comprises a circuit formed from capacitive, inductive or resistive reactance elements.

4. The antenna duplexer as claimed in claim 3, wherein the transmission filter or the reception filter comprises a bandpass filter circuit comprising surface acoustic wave (SAW) components that are formed on the piezoelectric substrate.

5. The antenna duplexer as claimed in claim 4, further comprising a weighted interdigital transducer.

6. The antenna duplexer as claimed in claim 5, wherein a series resonator has a weighted interdigital transducer.

7. The antenna duplexer as claimed in claim 3, wherein the matching element comprises at least one Pi or T circuit formed from capacitive, inductive or resistive elements.

8. The antenna duplexer as claimed in claim 7, wherein the matching element comprises an acoustically active or inactive interdigital structure on a piezoelectric chip.

9. The antenna duplexer as claimed in claim 1, wherein the matching element together with the transmission filter and the reception filter attenuates transmission signals in a frequency interval between 1574 and 1577 MHz by at least 50 dB.

10. The antenna duplexer as claimed in claim 1, wherein the antenna duplexer is configured for use in a mobile communication appliance having a GPS receiver.

11. The antenna duplexer as claimed in, claim 1 wherein the transmission filter or the reception filter comprises a bandpass filter circuit comprising bulk acoustic wave (BAW) components.

12. The antenna duplexer as claimed in claim 1, wherein at least one of the transmission and reception filters have a plurality of ground connections that are connected to a jointly used ground connecting pad.

13. The antenna duplexer as claimed in claim 1, wherein the reception filter and transmission filter circuits are formed in one or more chips that are arranged and connected on a high temperature cofired ceramic (HTCC), low temperature cofired ceramic (LTCC) or laminate mount substrate.

14. The antenna duplexer as claimed in claim 13, wherein the matching element is at least partially integrated in the one or more chips.

15. The antenna duplexer as claimed in claim 13, wherein the mount substrate comprises a plurality of layers in which the matching element is at least partially integrated.

16. The antenna duplexer as claimed in claim 1, wherein the reception frequency band is at frequencies higher than 2000 MHz.

17. The antenna duplexer as claimed in claim 1,
wherein the insertion loss in the transmission frequency band is less than 2 dB, and
wherein the matching element together with the transmission filter and the reception filter attenuates transmission signals in a frequency interval between 1400 and 1700 MHz by at least 45 dB.

18. The antenna duplexer as claimed in claim 1, wherein the transmission filter has a first bandpass filter with a first pass band and the reception filter has a second bandpass filter with a second pass band that is different than the first pass band.

19. The antenna duplexer as claimed in claim 18, wherein the first pass band is between 1710 and 1755 MHz, and the second pass band is between 2110 and 2155 MHz.

20. The antenna duplexer as claimed in claim 18, wherein the first pass band is between 1710 and 1770 MHz, and the second pass band is between 2110 and 2170 MHz.

21. The antenna duplexer as claimed in claim 18, wherein the first pass band is between 1900 and 1920 MHz, and the second pass band is between 2600 and 2620 MHz.

22. The antenna duplexer as claimed in claim 18, wherein the first pass band is between 1920 and 1980 MHz, and the second pass band is between 2110 and 2170 MHz.

23. The antenna duplexer as claimed in claim 18, wherein the first pass band is between 2010 and 2025 MHz, and the second pass band is between 2585 and 2600 MHz.

24. The antenna duplexer as claimed in claim 18, wherein the first pass band is between 2500 and 2570 MHz, and the second pass band is between 2620 and 2690 MHz.

25. The antenna duplexer as claimed in claim 1, wherein the ladder-type filter circuit comprises additional interdigital structures that are each connected in parallel with a parallel resonator, the interdigital structures comprising electrode fingers aligned on the piezoelectric substrate to produce a negligible electro acoustic coupling coefficient.

* * * * *